(12) United States Patent
Bu (10) Patent No.: US 8,274,824 B1
(45) Date of Patent: Sep. 25, 2012

(54) HIGH-PERFORMANCE CMOS-COMPATIBLE NON-VOLATILE MEMORY CELL AND RELATED METHOD

(75) Inventor: Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 363 days.

(21) Appl. No.: 12/589,333

(22) Filed: Oct. 22, 2009

Related U.S. Application Data (60) Provisional application No. 61/197,602, filed on Oct. 29, 2008.

(51) Int. Cl.
*G11C 11/34* (2006.01)

(52) U.S. Cl. ............... 365/185.03; 365/104; 365/185.05

(58) Field of Classification Search ............ 365/185.03, 365/200, 185.09, 185.24, 185.02, 185.17, 365/185.05, 185.11, 104
See application file for complete search history.

(56) References Cited

U.S. PATENT DOCUMENTS

| | | | |
|---|---|---|---|
| 5,555,521 A * | 9/1996 | Hamada et al. | 365/185.03 |
| 6,897,533 B1 | 5/2005 | Yang et al. | |
| 6,967,373 B2 | 11/2005 | Choi | |
| 7,116,577 B2 | 10/2006 | Eitan | |
| 7,391,647 B2 | 6/2008 | Fang et al. | |
| 7,433,232 B2 * | 10/2008 | Geissler et al. | 365/185.17 |
| 7,586,792 B1 | 9/2009 | Bu et al. | |
| 7,773,423 B1 * | 8/2010 | Bu | 365/185.18 |
| 7,872,909 B2 * | 1/2011 | Song et al. | 365/185.03 |
| 7,944,745 B2 * | 5/2011 | Haggag et al. | 365/185.08 |
| 2007/0217258 A1 * | 9/2007 | Wang | 365/185.03 |
| 2008/0175046 A1 * | 7/2008 | Kuo et al. | 365/185.03 |
| 2008/0266947 A1 * | 10/2008 | Wang | 365/185.03 |
| 2008/0266958 A1 * | 10/2008 | Haggag et al. | 365/185.11 |
| 2010/0008139 A1 * | 1/2010 | Bae | 365/185.03 |

OTHER PUBLICATIONS

Hemant V. Deshpande, et al., "Channel Engineering for Analog Device Design in Deep Submicron CMOS Technology for System on Chip Applications", IEEE Transactions on Electron Devices, vol. 49, No. 9, Sep. 2002, p. 1558-1565.

Akin Akturk, et al., "Faster CMOS Inverter Switching Obtained with Channel Engineered Asymmetrical Halo Implanted MOSFETs", downloaded Oct. 22, 2008, IEEE, p. 118-121.

Hyungsoon Shin, et al., "An 0.1-μm Asymmetric Halo by Large-Angle-Tilt Implant (AHLATI) MOSFET for High Performance and Reliability", 1999 IEEE, p. 820-822.

(Continued)

*Primary Examiner* — Dang Nguyen
(74) *Attorney, Agent, or Firm* — Eugene C. Conser; Wade J. Brady, III; Frederick J. Telecky, Jr.

(57) ABSTRACT

A memory cell includes a control gate and a transistor having a gate, a source junction, and a drain junction. The gate is coupled to the control gate, and the source junction and the drain junction are asymmetrical. For example, a channel doping associated with the source junction may be different than a channel doping associated with the drain junction. The memory cell also includes a write line coupled to the control gate, a source line coupled to the source junction of the transistor, and a bit line coupled to the drain junction of the transistor. The control gate could represent a second transistor, where the gates of the transistors are coupled together to form a floating gate. The memory cell could be programmed to store a single-bit value or a multiple-bit value, such as by storing the appropriate charge on the floating gate.

17 Claims, 4 Drawing Sheets

OTHER PUBLICATIONS

Partha Sarkar, et al., "The Effects of Varying Tilt Angle of Halo Implant on the Performance of Sub 100nm LAC MOSFETs", First International Conference on Industrial and Information Systems, ICIIS 2006, Aug. 8-11, 2006, Sri Lanka, p. 115-118.

K. Narasimhulu, et al., "The Effect of LAC Doping on Deep Submicrometer Transistor Capacitances and its Influence on Device RF Performance", IEEE Transactions on Electron Devices, vol. 51, No. 9, Sep. 2004, p. 1416-1423.

Saurav Chakraborty, et al., "Impact of Halo Doping on the Subthreshold Performance of Deep-Submicrometer CMOS Devices and Circuits for Ultralow Power Analog/Mixed-Signal Applications", IEEE Transactions on Electron Devices, vol. 54, No. 2, Feb. 2007, p. 241-248.

Mansun Chan, "Nano-CMOS Technology Options: From Traditional to Futuristic Device Structures", 3rd WIMNACT-Singapore, Oct. 2003, 44 pages.

Min-hwa Chi, et al., "Multi-level Flash/EPROM Memories: New Self-convergent Programming Methods for Low-voltage Applications", 1995 IEEE, p. 271-274.

* cited by examiner

HIGH-PERFORMANCE CMOS-COMPATIBLE NON-VOLATILE MEMORY CELL AND RELATED METHOD

CROSS-REFERENCE TO RELATED APPLICATIONS

This application claims priority under 35 U.S.C. §119(e) to U.S. Provisional Application No. 61/197,602 filed on Oct. 29, 2008, which is hereby incorporated by reference.

TECHNICAL FIELD

This disclosure is generally directed to memory cells and more specifically to a high-performance CMOS-compatible non-volatile memory cell and related method.

BACKGROUND

Conventional non-volatile memory (NVM) cells are routinely used in electronic circuitry, such as electronic consumer devices. However, fabricating conventional NVM cells using low-cost Complimentary Metal Oxide Semiconductor (CMOS) techniques presents various problems. For example, CMOS-compatible NVM cells are typically slow, and they often require high voltages to operate. Moreover, the size of conventional CMOS-compatible NVM cells are often much larger than other types of NVM cells. As a particular example, conventional CMOS-compatible NVM cells typically include transistors with floating gates and control gates that are not stacked, increasing the size of the NVM cells. This often reduces the density of the NVM cells and increases the cost of manufacturing the NVM cells.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
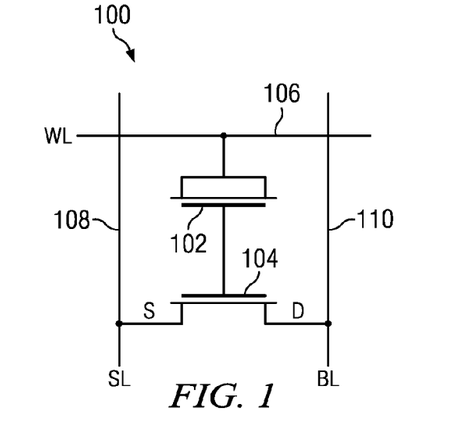
FIG. 1 illustrates an example non-volatile memory cell according to this disclosure.

FIG. 1 illustrates an example non-volatile memory cell 100 according to this disclosure. The embodiment of the memory cell 100 shown in FIG. 1 is for illustration only. Other embodiments of the memory cell 100 could be used without departing from the scope of this disclosure.

In this example, the memory cell 100 includes two transistors 102-104, a write line (WL) 106, a source line (SL) 108, and a bit line (BL) 110. As shown here, the transistor 102 has its source, drain, and substrate tied together and coupled to the write line 106. A gate of the transistor 102 is coupled to a gate of the transistor 104. A source of the transistor 104 is coupled to the source line 108, and a drain of the transistor 104 is coupled to the bit line 110.

Figure 2:
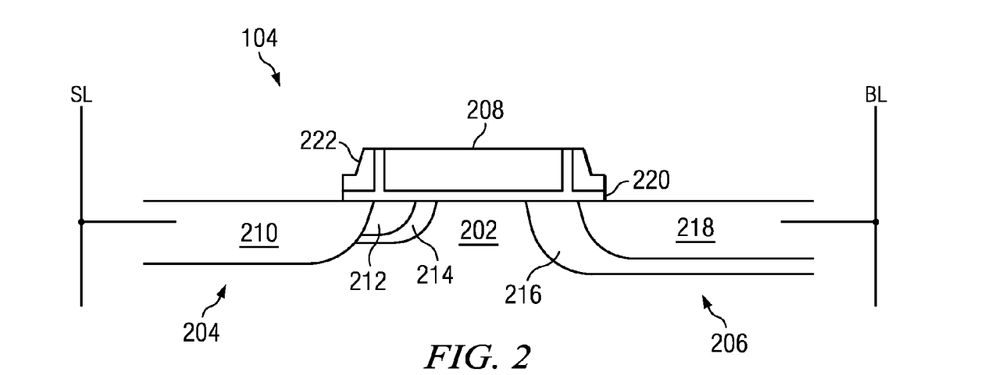
FIG. 2 illustrates an example transistor having asymmetrical source and drain junctions in a non-volatile memory cell according to this disclosure.

The transistor 102 is used as a control gate for the memory cell 100. The transistor 104 represents an asymmetrical transistor used as the program element for the memory cell 100. Both of the transistors 102-104 could represent metal oxide semiconductor (MOS) transistors. The transistor 104 is said to be "asymmetrical" because the source and drain junctions of the transistor 104 have different sizes or arrangements. For example, the channel doping adjacent to the source of the transistor 104 may be different compared to the channel doping adjacent to the drain of the transistor 104. As a particular example, the transistor 102 may represent an n-channel Complimentary Metal Oxide Semiconductor (CMOS) transistor. Also, the transistor 104 may represent an asymmetrical n-channel CMOS transistor having a source implant that extends farther under the gate of the transistor 104 than a drain implant. One example embodiment of the transistor 104 is shown in FIG. 2, which is described below.

In this example, the gates of the transistors 102-104 are coupled to each other, forming a floating gate. The gates of the transistors 102-104 are said to be "floating" since they are not coupled to any other component or potential. The floating gate could, for example, be used to store a charge during operation of the memory cell 100.

The write line 106 represents a wire, trace, or other electrically conductive line that is coupled to the source, drain, and substrate of the transistor 102 and is capable of conducting a voltage or current signal. Similarly, the source line 108 represents a wire, trace, or other electrically conductive line that is coupled to the source of the transistor 104 and is capable of conducting a voltage or current signal. In addition, the bit line 110 represents a wire, trace, or other electrically conductive line that is coupled to the drain of the transistor 104 and is capable of conducting a voltage or current signal.

The asymmetrical nature of the transistor 104 facilitates its use in the non-volatile memory cell 100. For example, the channel doping near the source junction of the transistor 104 can be much greater than the channel doping near the drain junction of the transistor 104 (such as 10 to 100 times as great). When applying the same bias to the source and drain junctions of the transistor 104, the source junction's electric field may be much higher than the drain junction's electric field. This feature can facilitate the use of the transistor 104 in a high-performance CMOS-compatible non-volatile memory cell 100. For instance, the transistor 104 can generate hot electrons from its source side with high efficiency during programming. The higher electric field at the source side of the transistor 104 facilitates hot electron generation and injection, which increases programming speed. Moreover, read operations involving the memory cell 100 can be performed from the drain side of the transistor 104. Reading from the drain side of the transistor 104 may help to mitigate bit line leakage, drain disturbances, and hot carrier lifetime and read access time issues that exist in traditional flash memories (which program and read both from the drain side).

During programming of the memory cell 100, a voltage bias can be applied to the source line 108, and the bit line 110 can be grounded. With an appropriate bias coupling provided from the write line 106 by the control gate (the transistor 102), hot electrons are generated and injected into the floating gate from the source side of the transistor 104. The amount of hot electrons injected into the floating gate may determine whether the memory cell 100 has been programmed with a "1" or "0" memory state.

During reading of the memory cell 100, the bit line 110 can be biased with a suitable bias voltage, and the source line 108 can be grounded. The electron density on the floating gate of the memory cell 100 determines the channel current through the transistor 104. For example, a higher channel current may indicate a memory state of "1," while a lower channel current may indicate a memory state of "0."

In particular embodiments, the source junction of the transistor 104 may have 10 times the doping compared to the drain junction of the transistor 104. Also, the transistor 104 may have a gate oxide thickness of 60 Å, a channel length of 10 μm, and a channel width of 0.3 μm. In addition, the source-side injection current of the transistor 104 is greater than the drain-side injection current for a given bias condition. For example, at a gate bias of 0.8V and a source-drain bias of +4.5V (such as where $V_S$=4.5V and $V_D$=0V), the gate injection current could be 11.6 times larger for the source side of the transistor 104 than for the drain side. This could facilitate more rapid programming of the memory cell 100, such as when the memory cell 100 is programmed using hot electron injection from the source side of the transistor 104.

Figure 4A:
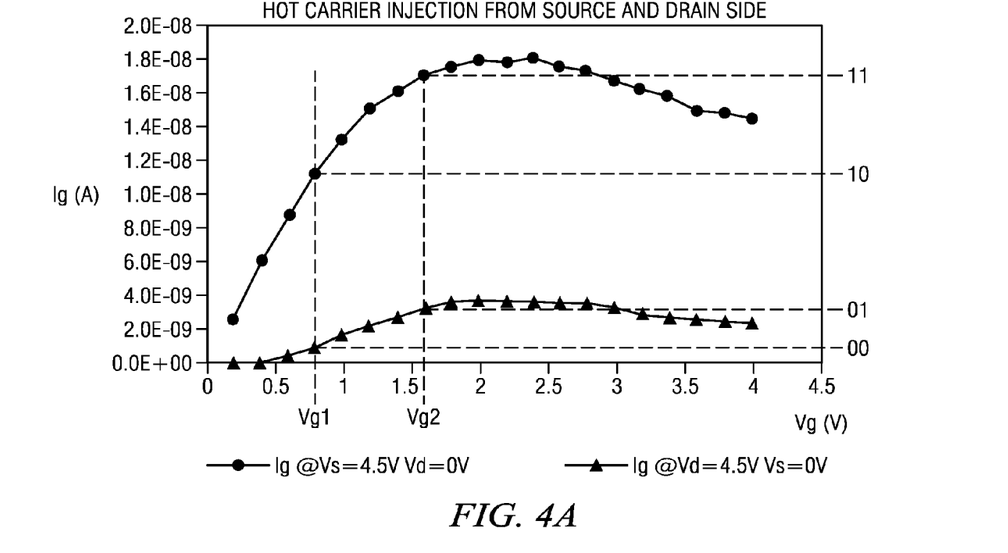
FIGS. 4A and 4B illustrate example behaviors of a multiple-state non-volatile memory cell according to this disclosure.
Figure 4B:
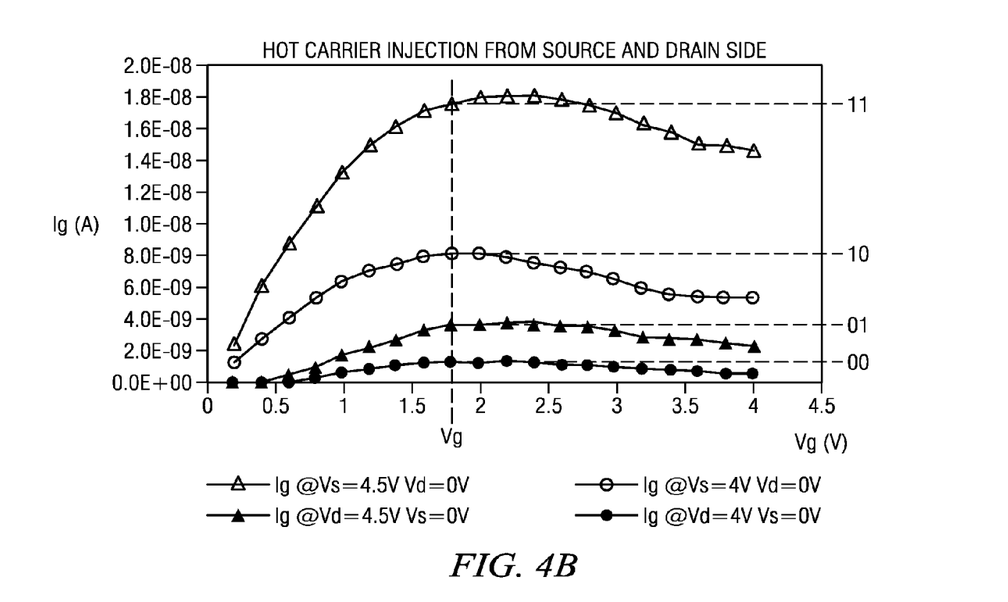

Moreover, the memory cell 100 may also support multi-level or multi-state storage. In other words, a single memory cell 100 could be programmed to more than just the "1" and "0" states, such as when the memory cell 100 can be programmed to a "00," "01," "10," or "11" state. This allows the single memory cell 100 to store multiple bits of information. For example, under the same gate bias and using the same programming time, different hot electron injection currents may flow to the floating gate from the source junction and the drain junction of the asymmetrical transistor 104. This may result in two different threshold levels, and altering the gate bias N times may provide $2^N$ threshold levels (N bits). Additional details regarding this functionality are shown in FIGS. 4A and 4B, which are described below.

Among other things, a non-volatile memory cell 100 implemented as shown in FIG. 1 could provide various benefits depending on the implementation. For example, a CMOS-compatible non-volatile memory cell 100 using an asymmetrical MOS transistor 104 could have a faster programming speed (such as 10 times faster when programmed from its source side). Also, conventional flash memories are often programmed and read from both the source and drain sides of a transistor, so both source and drain junctions are heavily doped. This often leads to reliability issues, such as higher bit line leakage, drain disturbances, shorter hot carrier lifetimes, and slower read access speeds. The non-volatile memory cell 100 may read the transistor 104 from its drain side (which may be lightly doped), reducing or eliminating these problems. In addition, multiple bits can be stored in the memory cell 100, and the memory cell 100 may not require complex programming verification as required in conventional multi-state memory cells. As a result, the memory cell 100 can increase memory density and is easily scaled, which may reduce its cost-per-bit without expensive process scaling.

Although FIG. 1 illustrates one example of a non-volatile memory cell 100, various changes may be made to FIG. 1. For example, the layout and arrangement of the transistors 102-104 and the signal lines 106-110 are for illustration only.

FIG. 2 illustrates an example transistor 104 having asymmetrical source and drain junctions in a non-volatile memory cell according to this disclosure. The embodiment of the transistor 104 shown in FIG. 2 is for illustration only. Other embodiments of the transistor 104 could be used without departing from the scope of this disclosure.

As shown in FIG. 2, the transistor 104 is formed using a semiconductor substrate 202. The substrate 202 could represent any suitable type of substrate, such as a silicon or other substrate.

The transistor 104 includes a source junction 204, a drain junction 206, and a gate 208. In this example, the source junction 204 includes a source implant 210, an asymmetrical source extension 212, and an asymmetrical source channel implant 214. Each of these implants and extensions represents a portion of the substrate 202 that has been doped with one or more suitable materials. For example, the source implant 210 could represent an N+ implant, the asymmetrical source extension 212 could represent an n type extension, and the asymmetrical source channel implant 214 could represent a p+ implant. Similarly, the drain junction 206 includes a lightly doped drain (LDD) implant 216 and a drain implant 218. Each of these implants represents a portion of the substrate 202 that has been doped with one or more suitable materials. For example, the lightly doped drain implant 216 could represent an n type implant, and the drain implant 218 could represent an N+ implant. In particular embodiments, all of the implants and extensions in the source junction 204 and the drain junction 206 could reside within a p-well in the substrate 202, and the p-well may be grounded.

In this example, the gate 208 represents any suitable structure acting as a gate of the transistor 104, such as a metallic or other conductive structure. As shown in FIG. 2, the gate 208 is separated from the substrate 202 by an oxide 220, which is often referred to as the "gate oxide" of the transistor 104. Also, the gate 208 is surrounded in this example by spacers 222, which represent a structure that could surround and be formed during fabrication of the gate 208. One example technique for forming a floating gate is disclosed in U.S. patent application Ser. No. 11/598,560 filed on Nov. 13, 2006, which is hereby incorporated by reference.

In this particular embodiment of the transistor 104, the source junction 204 of the transistor 104 is generally asymmetrical when compared to the drain junction 206 of the transistor 104. More specifically, the asymmetrical source extension 212 and the asymmetrical source channel implant 214 extend the source junction 204 of the transistor 104 farther under the gate 208 than the drain junction 206 of the transistor 104. This type of transistor 104 can be fabricated in any suitable manner, such as by using lateral asymmetrical channel technology known in the art. As a particular example, this type of transistor 104 could be fabricated using the technology described in the following U.S. patent applications (which are hereby incorporated by reference): 12/382,966; 12/382,967; 12/382,968; 12/382,969; 12/382,970; 12/382,971; 12/382,972; 12/382,973; 12/382,974; 12/382,976; and 12/382,977.

Although FIG. 2 illustrates one example of a transistor 104 having asymmetrical source and drain junctions in a non-volatile memory cell, various changes may be made to FIG. 2. For example, any other suitable asymmetrical transistor could be used in the non-volatile memory cell 100.

Figure 3:
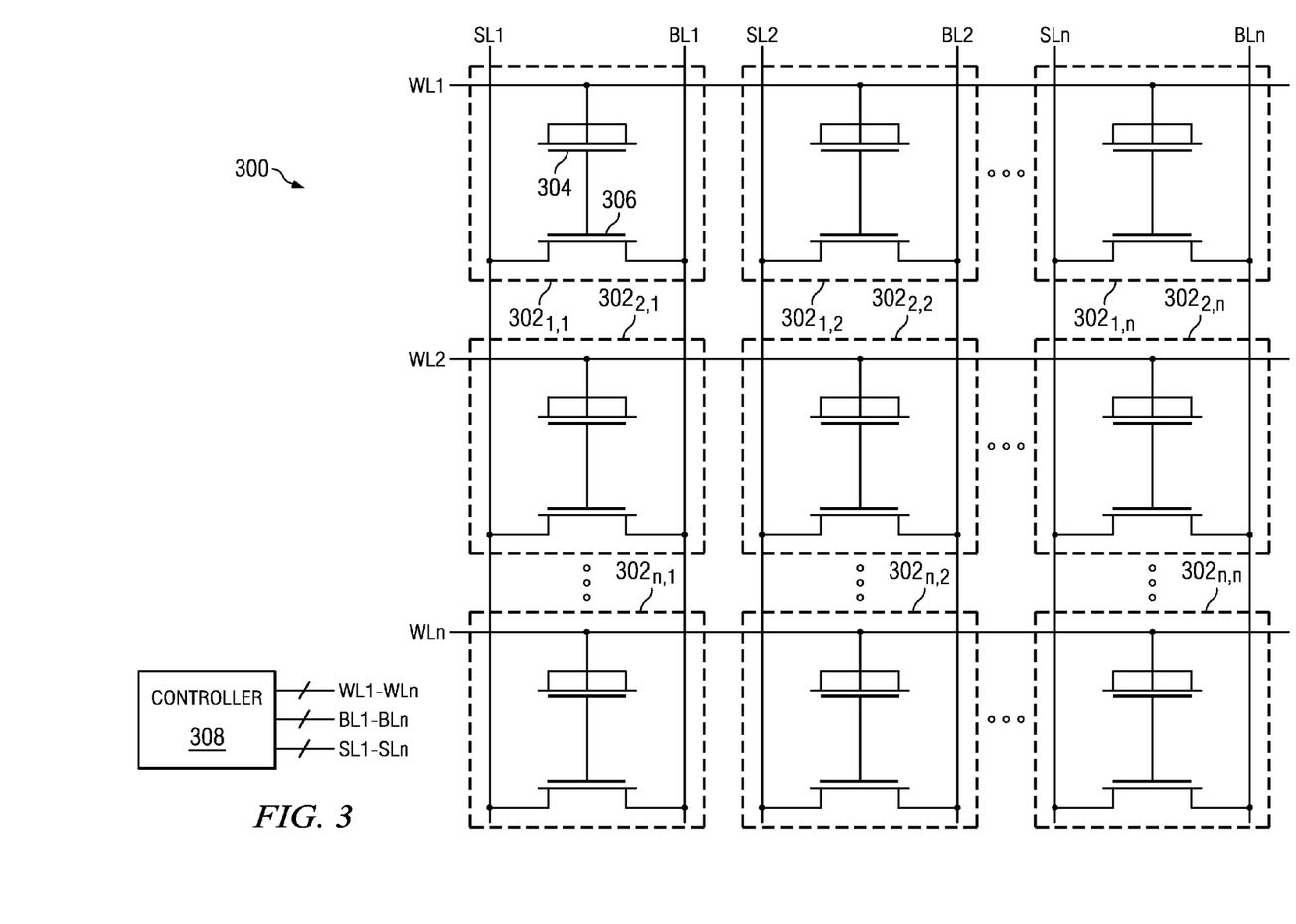
FIG. 3 illustrates an example non-volatile memory cell array according to this disclosure.

FIG. 3 illustrates an example non-volatile memory cell array 300 according to this disclosure. The embodiment of the memory cell array 300 shown in FIG. 3 is for illustration only.

Other embodiments of the memory cell array 300 could be used without departing from the scope of this disclosure.

In this example, the memory cell array 300 is formed from various memory cells $302_{1,1}$-$302_{1,n}$, $302_{2,1}$-$302_{2,n}$, ... $302_{n,1}$-$302_{n,n}$. At least some of the memory cells may be the same as or similar to the memory cell 100 shown in FIG. 1. Each memory cell could include a control gate transistor 304 and a program transistor 306, where the program transistor 306 could represent an asymmetrical transistor such as the one shown in FIG. 2. Each memory cell is coupled to one of multiple write lines (WL1-WLn), one of multiple source lines (SL1-SLn), and one of multiple bit lines (BL1-BLn). Each transistor 304 has its source, drain, and substrate coupled to one of the write lines. Each transistor 306 has its source coupled to one of the source lines and its drain coupled to one of the bit lines. The gates of the transistors 304-306 in each memory cell are coupled together and floating.

The memory array 300 also includes or is coupled to a controller 308. The controller 308 represents any suitable structure for controlling the operation of the memory cells in the array 300. In this example, the controller 308 is coupled to the write lines, bit lines, and source lines of the array 300 and provides suitable control signals to the lines. This enables the controller 308 to control, for example, the programming and reading of the memory cells in the array 300.

In this arrangement, a memory cell can be programmed when a voltage bias is applied to its source line, its bit line is grounded, and an appropriate bias coupling is provided from its write line by the control gate. Depending on the memory state being programmed, a certain amount of hot electrons are generated and injected to the floating gate from the source side of the transistor 306 in that memory cell.

A memory cell can be read in this arrangement when its bit line is biased and its source line is grounded. The electron density on the floating gate of that memory cell can be determined using the memory cell's bit line, thereby reading the memory cell from the drain side of the transistor 306 in that memory cell.

As noted above, multiple bits could be programmed into each of the memory cells in the array 300. As described above, it is possible to inject hot electrons into the floating gate using two different amounts of hot electrons (one amount from the source side of the transistor 306 and another amount from the drain side of the transistor 306). This provides two different memory states that can be programmed into the memory cell. Also, applying N different gate biases may provide $2^N$ threshold levels (N bits in a binary information system).

Examples of this behavior are shown in FIGS. 4A and 4B. Both of these figures illustrate the use of a two-bit/four-state memory cell. In FIG. 4A, a two-bit/four-state memory cell is obtained by varying the gate bias of the transistor 306 and fixing its source/drain bias. In FIG. 4B, a two-bit/four-state memory cell is obtained by varying the source/drain bias of the transistor 306 and fixing its gate bias. It should be noted that both a variable gate bias and a variable source/drain bias could also be used.

As shown in FIG. 4A, two different gate biases Vg1 and Vg2 can be applied to the gate of the transistor 306 in a memory cell. In this example, under the same source/drain bias (±4.5V), four memory states (00, 01, 10, and 11) can be obtained. These different memory states can be programmed using two different gate biases (Vg1 and Vg2) and by injecting hot electrons from the source side and/or the drain side of the transistor 306 into the floating gate of the memory cell.

As shown in FIG. 4B, a single gate bias Vg can be applied to the gate of the transistor 306 in a memory cell, and different source/drain biases can be applied to the transistor. In other words, the transistor 306 can be biased from its source side using its source line during source-side hot electron injection, and the transistor 306 can be biased from its drain side using its bit line during drain-side hot electron injection. In this example, under the same gate bias, the four memory states (00, 01, 10, and 11) can be obtained using different source/drain biases (such as $V_S$=4.5V and $V_D$=0V, $V_S$=0V and $V_D$=4.5V, $V_S$=4.0V and $V_D$=0V, $V_S$=0V and $V_D$=4.0V).

Examples of the signals that can be applied to the various write, source, and bit lines during multi-bit programming of the memory cell array 300 are shown in Table 1.

TABLE 1

| State | Selected SL | Selected BL | Selected WL | Unselected SLs, Bls, and WLs |
|---|---|---|---|---|
| 00 | 0 | $V_P$ | $V_{G1}$ | 0 |
| 01 | 0 | $V_P$ | $V_{G2}$ | 0 |
| 10 | $V_P$ | 0 | $V_{G1}$ | 0 |
| 11 | $V_P$ | 0 | $V_{G2}$ | 0 |

Here, $V_{G1}$ may equal or approximately equal 0.75V, $V_{G2}$ may equal or approximately equal 1.6V, and $V_P$ may equal or approximately equal ±4.5V. Note that Table 1 is based on the multi-bit programming technique shown in FIG. 4A. Other signals could be used to implement the multi-bit programming technique shown in FIG. 4B or any other programming technique. In particular embodiments, the entire array 300 shares a single p-well that is grounded, meaning all memory cells' substrate terminals are grounded.

Compared to prior techniques, the memory cells in the memory cell array 300 may achieve multi-bit storage without significant process changes, thereby reducing fabrication costs. Also, fabrication of the array 300 may not require deposition of a double poly and can take advantage of common features of CMOS platforms (such as features in nanoscale analog CMOS platforms). Further, because of the self-limiting feature of channel hot carrier injection, the array 300 does not require complex peripheral circuitry for precise programming time control and program verification. Beyond that, a read operation of a multi-bit memory cell in the array 300 may be the same as or similar to other multi-state non-volatile memories (such as those using three reference levels to distinguish the four memory states). In addition, multi-state storage in a CMOS-compatible memory cell can effectively scale the memory cell, improve memory density, and lower its cost-per-bit.

Although FIG. 3 illustrates one example of a non-volatile memory cell array 300, various changes may be made to FIG. 3. For example, the memory cell array 300 could have any suitable number of memory cells in any suitable arrangement. As a particular example, while shown as an n×n array, the memory cell array 300 could have any other equal or non-equal dimensions.

Although FIGS. 4A and 4B illustrate example behaviors of a multiple-state non-volatile memory cell, various changes may be made to FIGS. 4A and 4B. For instance, the specific voltages and currents shown in FIGS. 4A and 4B are for illustration only. Other gate bias voltages, source/drain bias voltages, and injection currents could be used in the memory cell array 300 or with individual memory cells 100.

Figure 5:
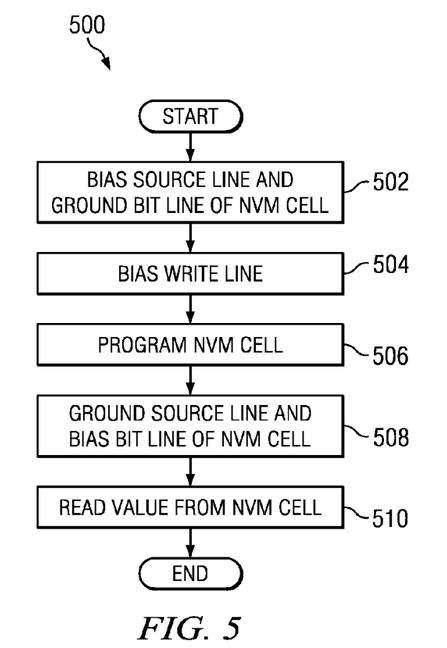
FIG. 5 illustrates an example method for writing data to and reading data from a non-volatile memory cell according to this disclosure.

FIG. 5 illustrates an example method 500 for writing data to and reading data from a non-volatile memory cell according to this disclosure. The embodiment of the method 500 shown in FIG. 5 is for illustration only. Other embodiments of the method 500 could be used without departing from the scope of this disclosure.

A source line of a memory cell is biased and a bit line of the memory cell is grounded at step 502. This could include, for example, biasing the source line 108 of the memory cell 100 with a ±4.5V signal and grounding the bit line 110 of the memory cell 100.

A write line of the memory cell is biased at step 504. This could include, for example, biasing the write line 106 of the memory cell 100 with a specified voltage. The specified voltage could be different depending on whether the memory cell 100 is being programmed to a "1" or "0" memory state.

The memory cell is programmed at step 506. This could include, for example, injecting hot electrons into the floating gate of the memory cell 100. The amount of hot electrons injected depends on whether the memory cell 100 is being programmed to a "1" or "0" memory state.

To read the memory state of the memory cell, the source line of the memory cell is grounded and the bit line of the memory cell is biased at step 508. This could include, for example, grounding the source line 108 of the memory cell 100. This could also include biasing the bit line 110 of the memory cell 100 with a suitable voltage for detecting the amount of hot electrons injected into the floating gate of the memory cell 100 during programming.

A value of the memory cell is read at step 510. This could include, for example, determining whether the current from the memory cell 100 represents a higher level of current or a lower level of current. The different current levels correspond to different memory states of the memory cell 100.

Although FIG. 5 illustrates one example of a method for writing data to and reading data from a non-volatile memory cell, various changes may be made to FIG. 5. For example, a higher amount of current (and the programming used to create it) may correspond to a "1" memory state, while a lower amount of current could correspond to the "0" memory state (or vice versa). Also, any other suitable voltages could be used to program and read the memory cell. In addition, while shown as a series of steps, various steps in FIG. 5 could overlap, occur in parallel, or occur multiple times.

Figure 6:
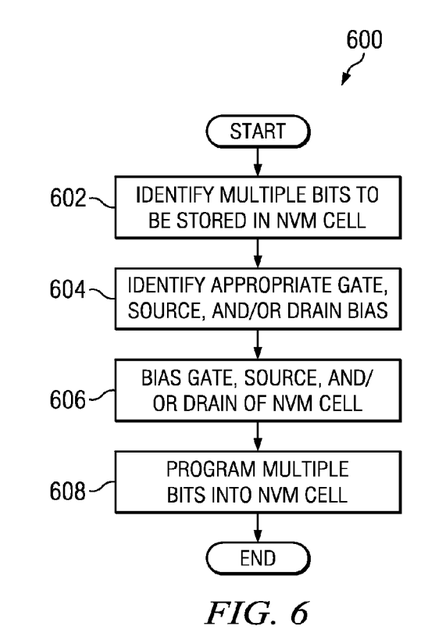
FIG. 6 illustrates an example method for writing multi-bit data to a non-volatile memory cell according to this disclosure.

FIG. 6 illustrates an example method 600 for writing multi-bit data to a non-volatile memory cell according to this disclosure. The embodiment of the method 600 shown in FIG. 6 is for illustration only. Other embodiments of the method 600 could be used without departing from the scope of this disclosure.

Multiple bits to be stored in a memory cell are identified at step 602. This could include, for example, determining whether the memory cell 100 should be programmed to have a 00, 01, 10, or 11 memory state.

Appropriate gate, source, and/or drain biases associated with that memory state are identified at step 604. For example, if the technique from FIG. 4A is used, this could include identifying one of multiple gate biases Vg1 and Vg2 to be used. This could also include determining whether the source-to-drain voltage of the transistor 104 is ±4.5V. If the technique from FIG. 4B is used, this could include identifying whether the source-to-drain voltage of the transistor 104 is +4.5V, −4.5V, +4.0V, or −4.0V (with a constant gate bias Vg).

The source, gate, and/or drain of the memory cell is biased accordingly at step 606. This could include, for example, applying the appropriate voltage signals on the write, source, and bit lines of the memory cell. This could also include grounding the source or bit line.

The memory cell is programmed at step 608. This could include, for example, injecting hot electrons into the floating gate of the memory cell. The amount of hot electrons injected depends on the memory state being programmed.

Although FIG. 6 illustrates one example of a method 600 for writing multi-bit data to a non-volatile memory cell, various changes may be made to FIG. 6. For example, more than two bits could be stored in the memory cell. Also, while shown as a series of steps, various steps in FIG. 6 could overlap, occur in parallel, or occur multiple times.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A memory cell comprising:
   a control gate;
   a transistor having a gate, a source junction, and a drain junction, wherein the gate is coupled to the control gate, and wherein the source junction and the drain junction are asymmetrical;
   a write line coupled to the control gate;
   a source line connected to the source junction of the transistor; and
   a bit line coupled to the drain junction of the transistor, wherein: the transistor comprises a first transistor; and the control gate comprises a second transistor, the second transistor having a gate coupled to the gate of the first transistor to form a floating gate, and the second transistor has a source, a drain, and a substrate directly coupled to the write line.

2. The memory cell of claim 1, wherein the transistors are configured such that a charge is placed on the floating gate when the source line is biased and the bit line is grounded.

3. The memory cell of claim 2, wherein:
   the charge on the floating gate is associated with one of multiple memory states; and
   the transistors are configured such that a current associated with the memory state is generated when the source line is grounded and the bit line is biased.

4. The memory cell of claim 1, wherein the transistors are configured such that a charge associated with a multiple-bit value is placed on the floating gate.

5. The memory cell of claim 4, wherein the transistors are configured such that the charge associated with the multiple-bit value is placed on the floating gate when one of multiple gate biases is applied to the gate of the first transistor.

6. The memory cell of claim 4, wherein the transistors are configured such that the charge associated with the multiple-bit value is placed on the floating gate when one of multiple source/drain biases is applied to the source junction and the drain junction of the first transistor.

7. The memory cell of claim 1, wherein the source junction and the drain junction of the transistor are asymmetrical in that a channel doping associated with the source junction is different than a channel doping associated with the drain junction.

8. The memory cell of claim 7, wherein:
the channel doping associated with the source junction includes a source implant, an asymmetrical source extension, and an asymmetrical source channel implant; and
the channel doping associated with the drain junction includes a lightly doped drain implant and a drain implant.

9. A memory array comprising:
a plurality of memory cells;
one or more write lines coupled to the memory cells;
one or more source lines coupled to the memory cells; and
one or more bit lines coupled to the memory cells;
wherein at least one of the memory cells comprises:
   a control gate;
   a transistor having a gate, a source junction, and a drain junction, wherein the gate is coupled to the control gate, and wherein the source junction and the drain junction are asymmetrical;
   a write line coupled to the control gate;
   a source line connected to the source junction of the transistor; and
   a bit line coupled to the drain junction of the transistor, wherein: the transistor comprises a first transistor; and the control gate comprises a second transistor, the second transistor having a gate coupled to the gate of the first transistor to form a floating gate, and the second transistor has a source, a drain, and a substrate directly coupled to the write line.

10. The memory array of claim 9, wherein the transistors in one of the memory cells are configured such that a charge is placed on the floating gate of the memory cell when the source line coupled to the memory cell is biased and the bit line coupled to the memory cell is grounded.

11. The memory array of claim 10, wherein:
the charge on the floating gate of the memory cell is associated with one of multiple memory states; and
the transistors in the memory cell are configured such that a current associated with the memory state is generated when the source line coupled to the memory cell is grounded and the bit line coupled to the memory cell is biased.

12. The memory array of claim 9, wherein the transistors in one of the memory cells are configured such that a charge associated with a multiple-bit value is placed on the floating gate of the memory cell.

13. The memory array of claim 12, wherein the transistors in the memory cell are configured such that the charge associated with the multiple-bit value is placed on the floating gate when one of multiple gate biases is applied to the gate of the first transistor in the memory cell.

14. The memory array of claim 12, wherein the transistors are configured such that the charge associated with the multiple-bit value is placed on the floating gate when one of multiple source/drain biases is applied to the source junction and the drain junction of the first transistor in the memory cell.

15. A method comprising:
placing a charge on a floating gate in a memory cell to program the memory cell, the floating gate comprising a connection between a control gate and a transistor in the memory cell, the charge created by injecting hot electrons onto the floating gate from a source junction of the transistor, wherein a source, a drain and a substrate of the control gate are connected together, and directly connected to a write line; and
reading a memory state of the memory cell at a drain junction of the transistor, the memory state associated with the charge on the floating gate.

16. The method of claim 15, wherein placing the charge on the floating gate comprises placing a charge associated with a multiple-bit value on the floating gate, the charge created by injecting hot electrons onto the floating gate from the source junction and the drain junction of the transistor.

17. The method of claim 16, wherein placing the charge associated with the multiple-bit value on the floating gate comprises at least one of:
applying one of multiple gate biases to a gate of the transistor; and
applying one of multiple source/drain biases to the source junction and the drain junction of the transistor.

* * * * *